(12) United States Patent
Nakata

(10) Patent No.: US 8,716,590 B2
(45) Date of Patent: May 6, 2014

(54) STACKED SOLAR CELL DEVICE

(75) Inventor: Josuke Nakata, Kyoto (JP)

(73) Assignee: Kyosemi Corporation, Kyoto (JP)

( * ) Notice: Subject to any disclaimer, the term of this patent is extended or adjusted under 35 U.S.C. 154(b) by 929 days.

(21) Appl. No.: 12/311,988

(22) PCT Filed: Nov. 17, 2006

(86) PCT No.: PCT/JP2006/323017
§ 371 (c)(1),
(2), (4) Date: Apr. 21, 2009

(87) PCT Pub. No.: WO2008/059593
PCT Pub. Date: May 22, 2008

(65) Prior Publication Data
US 2010/0018568 A1 Jan. 28, 2010

(51) Int. Cl.
*H01L 31/042* (2006.01)

(52) U.S. Cl.
USPC .......................................... 136/246; 136/250

(58) Field of Classification Search
USPC .................................. 136/250, 246
See application file for complete search history.

(56) References Cited

U.S. PATENT DOCUMENTS

| 3,134,906 | A | | 5/1964 | Henker | |
|---|---|---|---|---|---|
| 3,427,200 | A | * | 2/1969 | Ernest et al. | 136/246 |
| 3,984,256 | A | | 10/1976 | Fletcher et al. | |
| 4,069,812 | A | * | 1/1978 | O'Neill | 136/246 |
| 4,638,110 | A | | 1/1987 | Erbert | |
| 4,834,805 | A | | 5/1989 | Erbert | |
| 5,437,736 | A | | 8/1995 | Cole | |
| 5,482,568 | A | | 1/1996 | Hockaday | |
| 5,720,827 | A | | 2/1998 | Simmons | |
| 6,204,545 | B1 | * | 3/2001 | Nakata | 257/459 |
| 6,252,155 | B1 | | 6/2001 | Ortabasi | |
| 6,440,769 | B2 | | 8/2002 | Peumans et al. | |
| 6,653,551 | B2 | | 11/2003 | Chen | |
| 6,762,359 | B2 | * | 7/2004 | Asai et al. | 136/250 |
| 7,205,626 | B1 | | 4/2007 | Nakata | |

(Continued)

FOREIGN PATENT DOCUMENTS

| FR | 2 327 643 | 5/1977 |
|---|---|---|
| FR | 2 417 188 | 9/1979 |

(Continued)

*Primary Examiner* — Devina Pillay
(74) *Attorney, Agent, or Firm* — Jordan and Hamburg LLP

(57) ABSTRACT

This stacked solar battery device includes a plurality of solar battery units 4, an enclosure case made of a metal plate to house these solar battery units 4 therein, a cover glass having a partial cylindrical lens formed. The plurality of solar battery units 4 are housed in a plurality of recesses of the enclosure case, and are sealed with a sealing material of synthetic resin. The solar battery unit 4 has a planar light receiving solar battery module 10, and rod light receiving solar battery modules 30 and 50 stacked so that the module having a shorter center wavelength of the sensitivity wavelength band is positioned closer to the incident side of the sunlight. The solar battery module 10 is configured so that five planar light receiving solar-battery cells 11 are connected in parallel with four connection rods 20*a* and 20*b*, and the sunlight modules 30 and 50 are configured so that five sub modules 31 and 51 are connected in parallel respectively with the connection rods 40*a*, 40*b*, 60*a* and 60*b*. The sub modules 31 and 51 are configured so that a plurality of rod-shaped solar battery cells 32 and 52 respectively are connected in series.

12 Claims, 11 Drawing Sheets

(56) References Cited

U.S. PATENT DOCUMENTS

| | | |
|---|---|---|
| 7,220,997 B2 | 5/2007 | Nakata |
| 7,238,968 B2 | 7/2007 | Nakata |
| 8,030,569 B2 | 10/2011 | Nakata |
| 2005/0127379 A1 | 6/2005 | Nakata |
| 2006/0272698 A1* | 12/2006 | Durvasula .................... 136/246 |
| 2006/0283498 A1* | 12/2006 | Gronet .......................... 136/256 |
| 2007/0169804 A1 | 7/2007 | Nakata |

FOREIGN PATENT DOCUMENTS

| | | |
|---|---|---|
| JP | 7-221335 | 8/1995 |
| JP | 7-335925 | 12/1995 |
| JP | 2000-022184 | 1/2000 |
| WO | WO-02/35613 | 5/2002 |
| WO | WO-03/017383 | 2/2003 |
| WO | WO-03/036731 | 5/2003 |
| WO | WO-04/001858 | 12/2003 |
| WO | WO-2005/088733 | 9/2005 |

* cited by examiner

STACKED SOLAR CELL DEVICE

TECHNICAL FIELD

The present invention relates to a stacked solar battery device in which a plurality of solar battery modules having different sensitivity wavelength bands are stacked in order to effectively utilize wavelength components in a wide range of sunlight spectrum. Particularly, the invention relates to the stacked solar battery device in which the solar battery module is stacked so that the larger the forbidden band of a semiconductor the solar battery module has, that is, the shorter center wavelength of the sensitivity wavelength band the solar battery module has, the closer to an incident side of sunlight the solar battery module is positioned.

BACKGROUND TECHNOLOGY

For the spread of the solar battery device, there are important elements such as convenience, photoelectric conversion efficiency, production cost, quality stability, lifetime of the device, energy consumption required for manufacturing the solar battery, disposal after use and the like of the solar battery or the solar battery module.

As examples of the solar battery, there are known (A) a planar light receiving solar battery, (B) a solar battery in which granular solar battery cells are arranged in a panel shape of a plurality of rows and columns, (C) a solar battery in which a plurality of fiber solar battery cells are arranged in a panel shape, (D) a tandem solar battery, (E) a stacked solar battery, etc.

The solar battery of above (B) is proposed in, patent application publications WO02/35613, WO03/017383, WO03/036731, WO2004/001858, etc. The solar battery of above (C) is proposed in patent publications of U.S. Pat. Nos. 3,984,256, 5,437,736, etc. The tandem solar battery of above (D) is manufactured in order to enhance the photoelectric conversion efficiency of a single solar battery cell. In this solar battery, the sensitivity wavelength band of the sunlight spectrum is divided into plural bands, and semiconductors having the forbidden band optimal to each of the sensitivity wavelength bands are used to make pn junctions, which are crystal-grown continuously on a common semiconductor substrate.

The stacked solar battery of above (E) is manufactured in order to enhance the use efficiency and the photoelectric conversion efficiency of the sunlight spectrum. In this solar battery, plural kinds of solar battery modules of planar type are manufactured respectively with the solar battery cell made of a semiconductor having the forbidden band optimal to respective sensitivity wavelength band of the sunlight spectrum, and plural kinds of solar battery modules are vertically stacked.

In the solar batteries of (A) to (E), technologies are employed in which the sunlight is collected by a lens and a reflector to increase the energy density. In this case, not only the photoelectric conversion efficiency is improved, but also a high output is obtained with a relatively small light receiving area; therefore, the cost of the solar battery can be reduced. These technologies have been already disclosed in many academic documents and patent publications.

For example, the technology for collecting light in the solar battery is disclosed in patent publications of U.S. Pat. Nos. 4,834,805, 4,638,110, etc. Since with the light collection, the temperature of the solar battery cell rises and the photoelectric conversion efficiency is reduced to be liable to deteriorate the solar battery module; it is important how efficiently to radiate the generated heat due to the light collection. Patent publications of U.S. Pat. Nos. 5,482,568, 6,252,155, 6,653,551 and 6,440,769 disclose a solar battery employing a configuration where the solar battery cell is housed in a bottom portion of a plurality of cone-like reflection surfaces, which the reflection surface collects the light and radiates the generated heat.

However, the tandem solar battery and the stacked solar battery have a flat receiving surface, and receive the light from the receiving surface only; thus, they cannot convert effectively photoelectrically with respect to reflected and scattered lights coming from plural directions around. Moreover, a plurality of planar pn junctions formed in the solar battery are each a single pn junction having the same area, and connected in series. Therefore, among the plurality of pn junctions constituting the tandem solar battery or the stacked solar battery, the pn junction with the smallest output current restricts the output current. Accordingly, there is a problem in which the pn junction which intrinsically can output the high output current singularly cannot exhibit the output to a maximum extent.

In addition, the tandem solar battery must have a configuration where semiconductor crystals different in the forbidden band and a lattice constant are grown into a thin film on a common semiconductor substrate, and a tunnel junction different from the pn junction is formed in each layer. In order to grow continuously the different kinds of semiconductors, the lattice constants have to be matched, the selectable semiconductor is limited, and it is necessary to control the precise composition in the thin film crystal growth, leading to an increased cost for a manufacturing device and works.

In the stacked solar battery of a wavelength dividing type in which plural kinds of solar battery modules are mechanically stacked, it is necessary to neither form the tunnel junction nor match the lattice constants. However, when stacking the solar batteries each having a planar single pn junction, unless a precise setting is performed for arrangement of the electrodes of the solar battery module, and an interval and a parallelism of the solar battery module, the output may passively be reduced by the electrode shielding and the reflection at the surface.

In order to solve the problems of the stacked solar battery described above, the present inventor, as shown in a publication of WO2005/088733, has proposed a stacked solar battery where independently manufactured are the planar light receiving solar battery modules and plural kinds of the solar battery modules made of a large number of spherical solar battery cells disposed in plural rows and plural columns, which are made of the semiconductor different in the forbidden bands. And these solar battery modules are stacked so that the module with the larger forbidden band is closer to the incident side of the sunlight.

In the stacked solar battery, when connecting in series the independent solar battery modules made of the semiconductors different in the forbidden band, the series connection number and the parallel connection number of the solar battery cells are selected so that the currents flowing in the respective solar battery modules are equal to one another, thereby the entire output can be maximized.

Patent Document 1: International Publication No. WO02/035613;
Patent Document 2: International Publication No. WO03/017383;
Patent Document 3: International Publication No. WO03/036731;
Patent Document 4: International Publication No. WO2004/001858;
Patent Document 5: U.S. Pat. No. 3,984,256;

Patent Document 6: U.S. Pat. No. 5,437,736;
Patent Document 7: U.S. Pat. No. 4,834,805;
Patent Document 8: U.S. Pat. No. 4,638,110;
Patent Document 9: U.S. Pat. No. 5,482,568;
Patent Document 10: U.S. Pat. No. 6,252,155;
Patent Document 11: U.S. Pat. No. 6,653,551;
Patent Document 12: U.S. Pat. No. 6,440,769; and
Patent Document 13: International Publication No. WO2005/088733.

DISCLOSURE OF THE INVENTION

Problems to be Solved by the Invention

However, in the stacked solar battery, increase of the number of the spherical solar battery cells results in the inevitable increase of the points to be electrically connected between the cells, leading to a high assembling cost including a wire connection cost, thereby, reliability of the device tends to decrease. Moreover, since there are generated gaps which cannot be filled even if a large number of spherical solar battery cells are arranged densely to a maximum extent, particularly in a case of receiving the light collected by a lens, the light passing through the gaps cannot be used sufficiently.

Objects of the invention is to provide a stacked solar battery device which is provided with at least one kind of solar battery module including a plurality of rod-shaped solar battery cells having a partial cylindrical pn junction and a pair of strap-shaped electrodes, to provide a stacked solar battery device in which the number of the solar battery cells and the number of connection points can be reduced by use of a rod-shaped solar battery cell to lower the cost, to provide a stacked solar battery device in which the photoelectric conversion efficiency can be improved by collecting light with a lens and a reflection surface and the production cost can be reduced, and to provide a stacked solar battery device in which heat radiation can be enhanced by the enclosure case made of metal, and so on.

Means to Solve the Problem

The present invention relates to a stacked solar battery device in which a plurality of solar battery modules are stacked in plural layers, characterized by comprising: plural kinds of solar battery modules with different sensitivity wavelength bands, the plural kinds of solar battery modules being stacked so that the solar battery module having a shorter center wavelength of the sensitivity wavelength band is positioned closer to an incident side of sunlight; wherein at least one kind of the solar battery module is constituted by a plurality of rod light receiving solar battery sub modules each of which is provided with a plurality of rod-shaped solar battery cells; and the rod-shaped solar battery cell comprises: a substrate made of a rod-shaped semiconductor crystal of a p-type or n-type semiconductor having a circular or partial circular cross-section; an another conductive layer formed at a portion of a surface layer of the substrate except for a strap-shaped portion parallel to an axial center of the substrate, and having a conductivity type different from the substrate; a pn junction formed with the substrate and the another conductive layer and having a partial cylindrical shape; a first strap-shaped electrode ohmic-connected to a surface of the strap-shaped portion of the substrate; and a second strap-shaped electrode ohmic-connected to a surface of the another conductive layer on an opposite side from the first electrode with respect to the axial center of the substrate.

Advantages of the Invention

The rod-shaped solar battery cell includes the rod-shaped substrate, the another (separate) conductive layer of a conductivity type different from the substrate, the partial cylindrical pn junction, and the first and second strap-shaped electrodes which are provided to both ends of the cell with respect to the axial center of the substrate being sandwiched therebetween and are connected to the pn junction. Thus, a distance from each point on the pn junction to the first and second electrodes is maintained at an almost constant small value. Therefore, the entire pn junction generates uniformly photovoltaic power, enabling keeping the photoelectric conversion efficiency of the rod-shaped solar battery cell high.

In a case of configuring the rod light receiving solar battery sub module by arranging a plurality of rod-shaped solar battery cells in parallel to be connected in series via the first and second electrodes, the voltage generated in the sub module can be varied by changing the diameter of the substrate to change the number of the plurality of rod-shaped solar battery cells.

In the solar battery module including a plurality of rod light receiving solar battery sub modules, such a configuration is adopted so that a plurality of rod light receiving solar battery sub modules are connected in parallel, and the current generated in the solar battery module can be varied by changing the number of the sub modules connected in parallel.

In the rod-shaped solar battery cell, since the length thereof in a direction of the axial center can be set several to a dozen times the diameter of the substrate, the light receiving area can be significantly increased compared with the granular solar battery cell. Additionally, a plurality of rod-shaped solar battery cells can be arranged densely in parallel to constitute the rod light receiving solar battery sub module, and a ratio of the light receiving area to a projected area of the sunlight can be set larger to increase light receiving efficiency for receiving the sunlight.

Moreover, the rod light receiving solar battery sub module can have a much smaller number of the electric connection points to connect the solar battery cells compared with the sub module having a plurality of granular solar battery cells. Therefore, assembling cost of the sub module including the electric connection cost can be significantly reduced.

The solar battery device includes plural kinds of solar battery modules whose sensitivity wavelength bands are each different from one another, and which solar battery modules are stacked so that the solar battery module having a shorter center wavelength of the sensitivity wavelength band is positioned closer to the incident side of sunlight; therefore, the sunlight in a wide wavelength range of the sunlight spectrum can be photoelectric-converted.

The shorter wavelength the light has, the less transmission the light has; thus, as described above, the plural kinds of solar battery modules are stacked so that the solar battery module having a shorter center wavelength of the sensitivity wavelength band is positioned closer to the incident side of the sunlight; therefore, the photoelectric conversion efficiency of each solar battery module can be enhanced.

In the solar battery device, plural kinds of vertically stacked solar battery modules are connected in series, and the output currents thereof are set substantially to the same current, allowing respective electric-generating capacities of the plural kinds of the solar battery modules to be exhibited to a maximum extent.

Since at least one kind of solar battery module is constituted by a plurality of rod light receiving solar battery sub modules, in respective sub modules the output voltage of the rod light receiving solar battery sub modules can be adjusted by varying the series connection number of the rod-shaped solar battery cell. Further, since the output current of the solar battery module thereof can be adjusted by varying the parallel connection number where a plurality of rod light receiving solar battery sub modules are connected in parallel, it becomes easy to uniform the output currents of plural kinds of solar battery modules vertically stacked.

As constitutions of dependent claims, following various constitutions may be adopted.

(1) At least one kind of solar battery module is constituted by a plurality of planar light receiving sub modules each of which is constituted by a planar light receiving solar battery cell having a planar pn junction.

(2) Three kinds of solar battery modules are provided in which two kinds of solar battery modules are each constituted by a plurality of rod light receiving solar battery sub modules, one kind of solar battery module is constituted by a plurality of planar light receiving sub modules. The solar battery module constituted by the plurality of planar light receiving sub modules is arranged on the uppermost position.

(3) Each rod light receiving solar battery sub module and each planar light receiving sub module are configured so that the light receiving area thereof is equal to each other.

(4) A plurality of rod-shaped solar battery cells in the rod light receiving solar battery sub module are arranged in parallel so that the conductive direction defined by the first and second electrodes is aligned in a horizontal direction, and are electrically connected in series via the first and second electrodes.

(5) A pair of first connection rods are provided which connect in parallel and couple integrally a plurality of rod light receiving solar battery sub modules constituting the solar battery module, and two pairs of second connection rods are provided which connect in parallel and couple integrally a plurality of planar light receiving sub modules constituting the solar battery module.

(6) An enclosure case made of a metal plate is provided which has one or more recess protruding downward; the recess of the enclosure case houses plural kinds of solar battery modules in a stacked state.

(7) The enclosure case has a plurality of recesses arranged in parallel and horizontally in the width direction of the recess, and plural kinds of solar battery modules are housed in a stacked state in each of the plurality of recesses.

(8) The recess of the enclosure case has substantially an inverted trapezoidal cross-section of which the width gradually increases upward, and a pair of side walls and the bottom wall of the recess have inner surfaces made to be light reflecting surfaces.

(9) A lens member having a lens portion which has a light collecting function to collect the sunlight toward the plurality of solar battery modules is provided closer to the incident side of sunlight than the plurality of solar battery modules.

(10) Spaces in the plurality of recesses of the enclosure case are filled with transparent synthetic resin sealing materials, and they are packaged by the enclosure case and the lens member.

(11) A trapezoidal protruding pedestal which protrudes upward by a slight predetermined height is formed at a bottom wall of the enclosure case.

(12) A plurality of end stopping blocks are provided each of which closes an end of the recess of the enclosure case to which the stopping block provided are a plurality of connection pipes made of metal for inserting ends of the first and second connection rods so as to be electrically connected, and the connection pipes being projected an outside of the end stopping block as external terminals.

Figure 1:
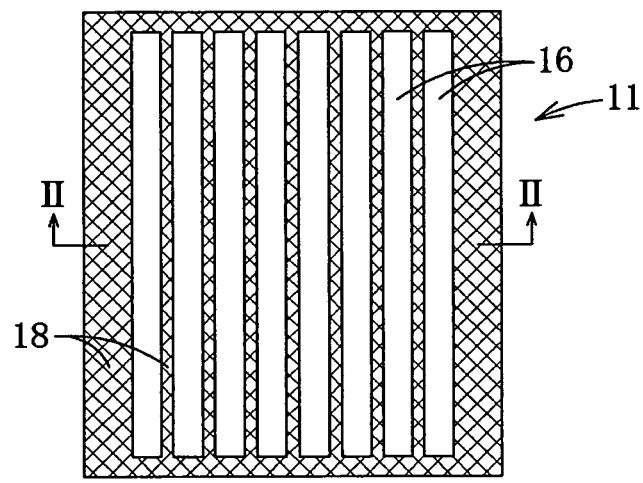
FIG. 1 is a plan view of a planar light receiving solar battery cell (sub module) installed in a solar battery device according to an embodiment of the present invention.

DESCRIPTION OF NUMERALS 1 solar battery device
2 enclosure case
2a side wall
2b bottom wall
2c protruding pedestal
3 recess
4 solar battery unit
5 cover glass (lens member)
5a lens portion
6 end stopping block
10 planar light receiving solar battery module
11 solar battery cell (sub module)
20a, 20b connection rod
20A, 20B connection pipe
30 solar battery module
31 rod light receiving sub module
32 solar battery cell
33 substrate (base material)
35 p-type GaAs layer (another conductive layer)
36 p-type GaAlAs layer
37 pn junction
38 negative electrode
39 positive electrode
40a, 40b connection rod
40A, 40B connection pipe
50 solar battery module
51 rod light receiving sub module
52 solar battery cell 53 substrate
55 n-type Ge diffusion layer (another conductive layer)
56 pn junction
57 positive electrode
58 negative electrode
60a, 60b connection rod
60A, 60B connection pipe
63 sealing material

BEST MODE FOR IMPLEMENTING THE INVENTION

A solar battery device according to the present invention is a stacked solar battery device in which a plurality of solar battery modules are stacked in plural layers, characterized by comprising: plural kinds of solar battery modules with different sensitivity wavelength bands, the plural kinds of solar battery modules being stacked so that the solar battery module having a shorter center wavelength of the sensitivity wavelength band is positioned closer to the incident side of sunlight; wherein at least one kind of the solar battery module is constituted by a plurality of rod light receiving solar battery sub modules each of which is provided with a plurality of rod-shaped solar battery cells. The rod-shaped solar battery cell includes a specific constitution as follows.

EMBODIMENT

Hereinafter, an embodiment of the present invention will be described with reference to the drawings.

As shown in FIGS. 11 to 15, a light collecting type stacked solar battery device 1 comprises an enclosure case 2 made of a metal plate, stacked solar battery units 4 respectively housed in three recesses 3 of the enclosure case 2, a sealing material 63 (not shown in FIG. 13) filled in each of the recesses 3, a cover glass 5 arranged on an incident side of sunlight, end stopping blocks 6 arranged at both ends of each of the recesses 3 of the enclosure case 2.

The stacked solar battery unit 4 comprises three kinds of solar battery modules 10, 30 and 50 which are different from one another in the sensitivity wavelength band, and the shorter center wavelength of the sensitivity wavelength band the solar battery module has, the closer to the incident side of the sunlight of the solar battery module is positioned. The first solar battery module 10 has five planar light receiving sub modules 11 connected in parallel as planar light receiving solar battery cells, and are arranged on an uppermost position.

The second solar battery module 30 has five rod light receiving solar battery sub modules 31 connected in parallel, each of which has four rod-shaped solar battery cells 32 connected in series, is arranged on the middle position next to the uppermost one. The third solar battery module 50 has five rod light receiving solar battery sub modules 51 connected in parallel, each of which has eight rod-shaped solar battery cells 52 connected in series, is arranged on a lowermost position. In the solar battery unit 4, the three kinds of solar battery modules 10, 30 and 50 are arranged in parallel at a predetermined interval.

Figure 2:
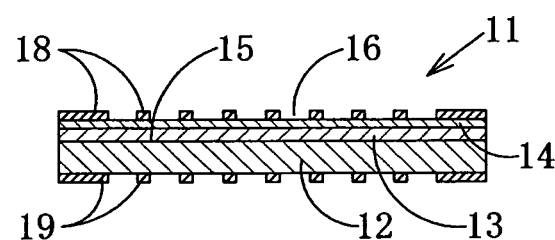
FIG. 2 is a cross-sectional view taken along a line II-II in FIG. 1.
Figure 3:
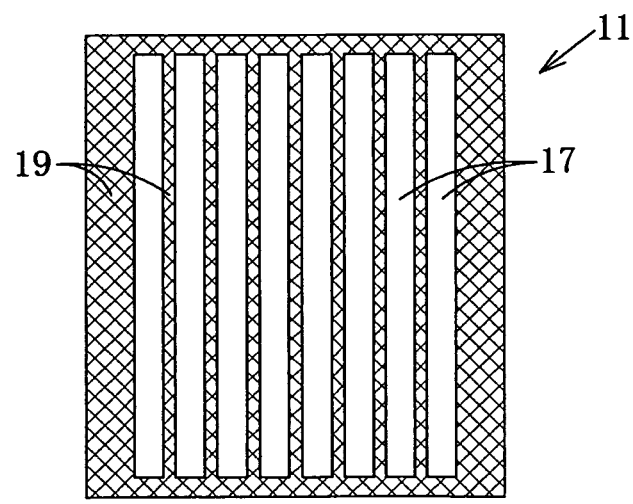
FIG. 3 is a bottom view of the solar battery cell in FIG. 1.

First, the planar light receiving sub module 11 is explained with reference to FIGS. 1 to 3. The planar light receiving sub module 11 includes a planar light receiving GaAsP/GaP solar battery cell. The GaAsP/GaP solar battery cell can be manufactured by a similar method to that of a well-known light-emitting diode emitting an orange color light.

The GaAsP/GaP solar battery cell (sub module 11) uses a n-type GaP single crystal wafer as a substrate 12, on which a n-type GaAsP layer 13 is grown by, for example, the vapor-phase epitaxial method (VPE). In this case, while a graded layer is formed where a ration of As to P increases gradually from a surface of the n-type GaP substrate 12, finally the n-type GaAs0.4P0.6 layer 13 having a constant composition is grown. Next, on a lower surface of the n-type GaP substrate 12, a silicon nitride film (Si3N4) is deposited as a diffusion mask for diffusing impurities, followed by diffusing zinc as p-type impurities on all over the surface of the GaAsP layer 13 so as to make a p-type GaAs0.4P0.6 layer 14 of 0.5 to 1.0 μm depth to form a planar pn junction 15.

Next, in a state of the silicon nitride film on the lower surface of the n-type GaP substrate 12 being removed, the lower surface is deposited with Au—Ge, and the surface of the p-type GaAs0.4P0.6 layer 14 is deposited with Au—Zn, followed by photo-etching. Thereby, as shown in FIGS. 1 and 3, both upper and lower surfaces of GaAsP/GaP solar battery cell 11 are formed thereon with a plurality of elongated rectangular slit windows 16 and 17 so as to be opposed relative to the both surfaces, and next, provided with positive electrodes 18 and negative electrodes 19 which are ohmic-connected to both surfaces respectively by sintering. Note that the entire surfaces except for the positive and negative electrodes 18 and 19 are covered with an antireflective film (not shown) of SiO2 and the like, of which drawings are omitted.

Figure 11:
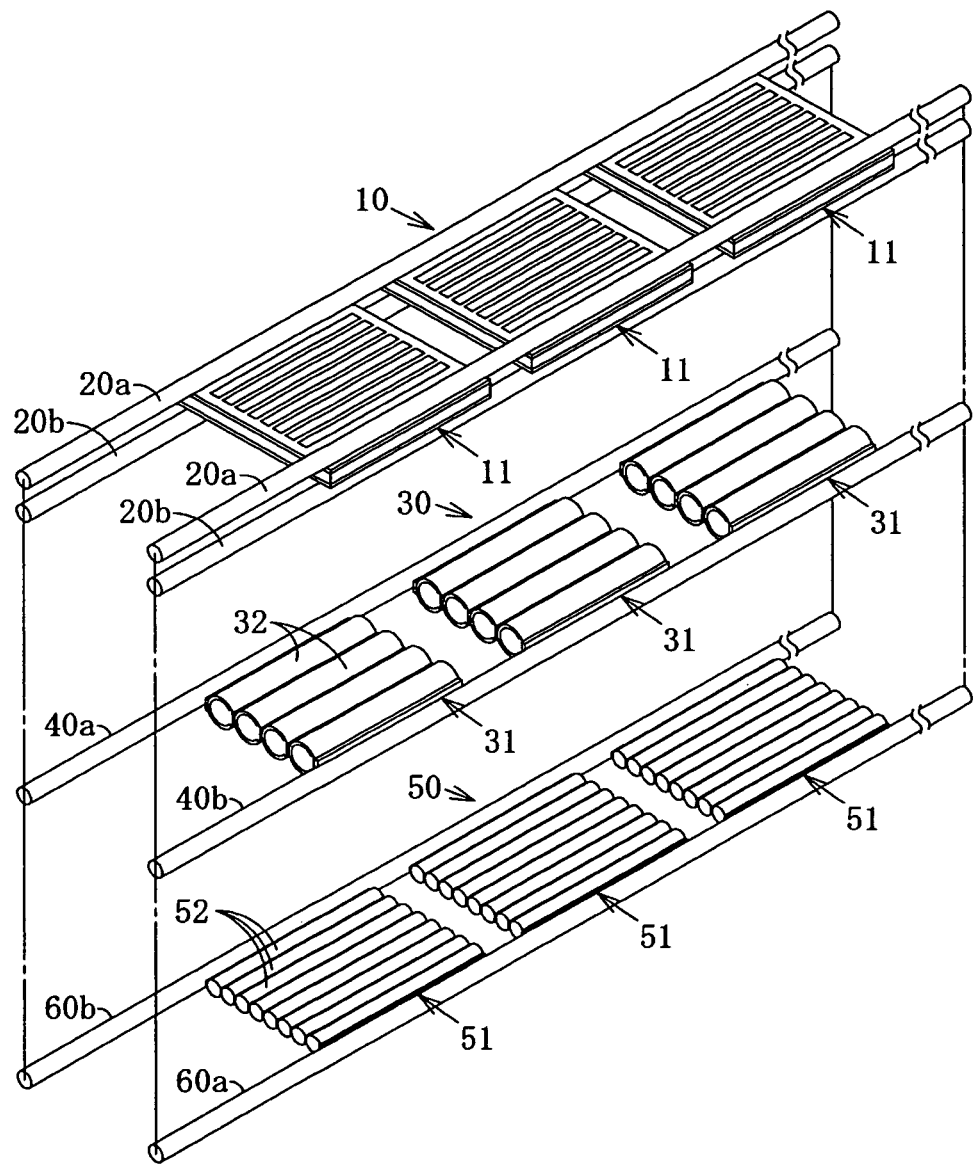
FIG. 11 is an disassembled perspective view of a solar battery unit.

As shown in FIG. 11, the first solar battery module 10 is configured such that, for example, five sub modules 11 are aligned in one plane with the positive electrodes 18 being directed upward and orientations of the slit windows 16 and 17 corresponding to each other, and connected in parallel. In a case of assembling the first solar battery module 10, prepared are four connection rods 20a and 20b each formed of a rod material made of copper or an alloy of nickel and iron with a diameter of 0.5 to 1.0 mm, and the five sub modules 11 have at one end upper and lower pair of connection rods 20a and 20b arranged, and at the other end upper and lower pair of connection rods 20a and 20b arranged.

The positive electrodes 18 on the upper surface side of the five sub modules 11 are electrically connected at both ends thereof to a pair of connection rods 20a as a positive electrode lead by soldering or an electrically conductive adhesive, and the negative electrodes 19 on the lower surface side of the five sub modules 11 are electrically connected at both ends thereof to a pair of connection rods 20b as a negative electrode lead by soldering or an electrically conductive adhesive.

The GaAsP layer 13 and the pn junction 15 in the sub module 11 are formed by not only the vaporphase epitaxial method but also the metalorganic chemical vapor deposition (MOCVD) and molecular beam epitaxial growth (MBE). Moreover, a thin p-type window layer with a increased ratio of P is additionally provided on the p-type GaAs0.4P0.6 layer 14 as needed, thereby a recombination rate of a carrier generated on the surface is effectively decreased to enhance photoelectric conversion efficiency.

Figure 20:
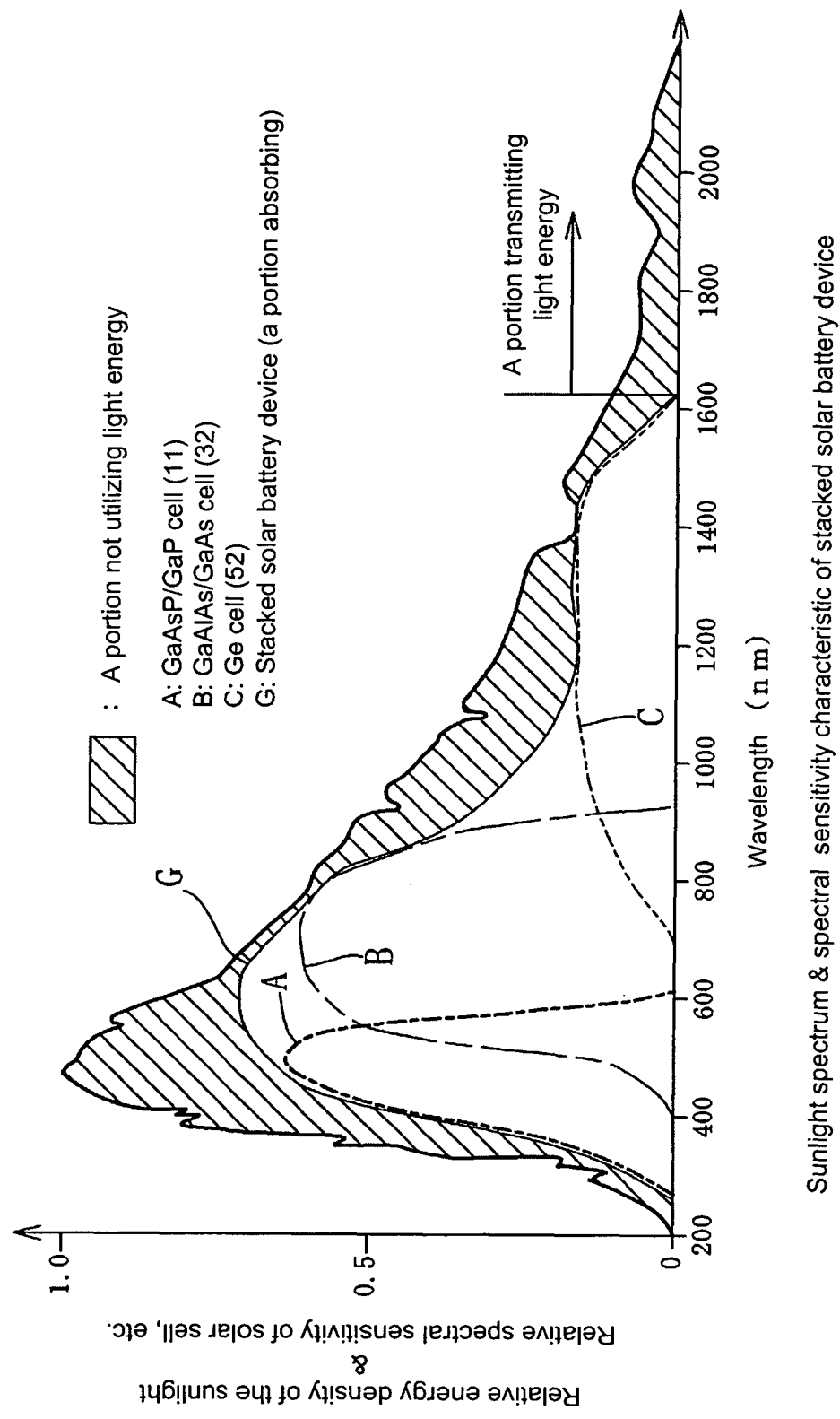
FIG. 20 is a graph illustrating sunlight spectra versus a spectral sensitivity characteristic of the solar battery device.

The planar light receiving sub module 11 including the GaAsP/GaP solar battery cell performs a photoelectric conversion by absorbing sunlight in a range of spectral sensitivity (wavelength sensitivity band) shown by a curve A in FIG. 20, however sunlight of a wavelength longer than the range travels through the slit windows 16 and 17 of the GaAsP/GaP solar battery cell 11 downwards. The sub module 11 has a size of about 7 mm in length, 6 mm in width and 0.4 mm in thickness, for example.

Note that, it is possible to increase productivity of the cell by that many solar battery cells are formed on the common GaP substrate 12 of a larger size at the same time, and thereafter, the substrate is divided into the solar battery cells having a size described above. In this case, a portion having a locally inferior property can be eliminated compared with the case where the GaP substrate 12 of a larger size is used to make a single solar battery cell of a larger size. Therefore, deterioration of the entire solar battery cells does not occur due to cracks of the substrate 12, allowing an expensive compound semiconductor to be effectively used.

Next, for explaining a configuration of rod-shaped solar battery cells 32 and 52 adopted to the rod light receiving solar battery sub modules 31 and 51 of the second and third solar battery modules 30 and 50, a rod-shaped solar battery cell 70 having a similar configuration to those will be described.

Figure 4:
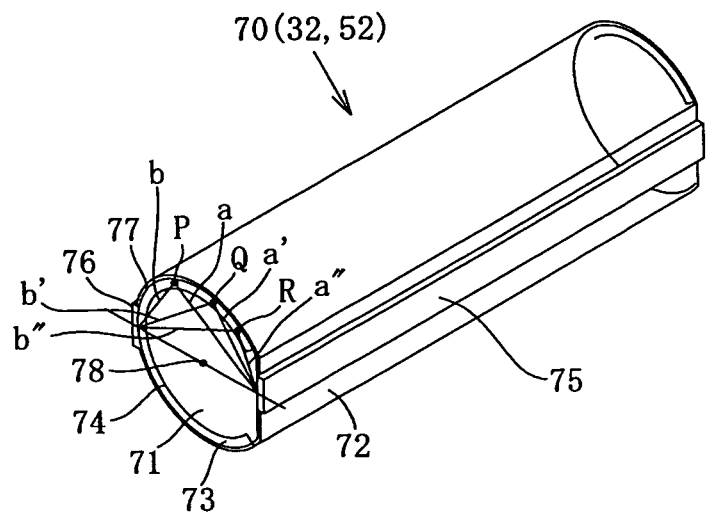
FIG. 4 is a perspective view of a rod-shaped solar battery cell.

As shown in FIG. 4, the rod-shaped solar battery cell 70 is manufactured using a substrate 71 (base material) of a rod which has a circular cross-section and is made of semiconductor crystal of a single elements such as Si, Ge, etc., or a compound semiconductor crystal of a III-V group elements and a II-VI group elements.

The rod-shaped semiconductor crystal is manufactured by a method where, for example, with Ge and Si, a rod-shaped seed crystal is passed through a thin diameter nozzle of a crucible to be contacted with a melt, and is cooled with being pulled upward or downward to continuously grow a rod of a single crystal in an elongated shape. With a semiconductor of Si, Ge, GaAs, GaSb, etc., this method can be used to manufacture a single crystal rod having a diameter of 0.5 to 2.5 mm.

However, with a material difficult to be grown into such a thin diameter rod, it may be that the material is mechanically cut out from a bulk crystal to be formed into a rod shape. The elongated rod-shaped semiconductor crystal is divided such that each divided portion has a length of about three to ten times the diameter thereof to form the substrate of a semiconductor crystal to be formed into the rod-shaped solar battery cell 70. Note that the length of the substrate is not limited to that of about three to ten times the diameter, but the division may be performed so that the length be ten times or more, or several tens times the diameter of the substrate 71. When this division is performed, the rod-shaped semiconductor crystal is cut perpendicularly to the axial center of the rod. The rod-shaped solar battery cell 70 is manufactured as follows using, as the substrate, the rod-shaped semiconductor crystal of a circular cross-section described above.

First, for example, as shown in FIG. 4, the substrate 71 of the n-type semiconductor crystal is prepared, and next, a part of a surface portion of the substrate 71 is cut out parallel to the axial center to form a strap-shaped flat surface 72 (strap-shaped portion) parallel to the axial center. Note that a width of the flat surface 72 is set about 0.4 to 0.6 times the diameter of the substrate 71. Subsequently, a partial cylindrical p-type layer 73 (another conductive layer) is provided on a surface layer of the substrate 71 except for the flat surface 72 and the vicinity of both sides thereof, and a partial cylindrical pn junction 74 is formed along the entire length of the substrate 71. The flat surface 72 of the substrate 71 has a strap-shaped negative electrode 75 formed thereon which is ohmic-connected to a n-type semiconductor crystal (substrate 71) and in parallel to the axial center of the substrate 71. On the opposite side from the negative electrode 75 with respect to the axial center of the substrate 71, a surface of the p-type layer 73 has a strap-shaped positive electrode 76 formed thereon which is ohmic-connected thereto and parallel to the axial center of the substrate 71. Then, the entire surface except for the positive and negative electrodes 76 and 75 is covered by a transparent insulating antireflective film 77.

Almost all the surface of the rod-shaped solar battery cell 70 except for the positive and negative electrodes 76 and 75 as well as the flat surface 72 and the vicinity thereof is a surface capable of receiving sunlight. Moreover, a projected cross-sectional area of the substrate 71 viewed in a direction perpendicular to the axial center 78 is approximately constant except for the flat surface 72, therefore, a light receiving area with respect to an directly incident sunlight is approximately constant independently of an incident light angle. A total of distances from each of points P, Q and R in the pn junction 74 to the positive and negative electrodes 76 and 75, that is (a+b), (a'+b') and (a"+b"), is almost constant. Therefore, a distribution of current flowing in the pn junction 74 is excellent in symmetry and uniformity, and directionality to an incident sunlight is small, allowing photoelectric conversion with a high efficiency.

However, it may be possible that the substrate is constituted by the p-type semiconductor and the surface layer thereof is formed with the partial cylindrical n-type semiconductor layer (another conductive layer). As for forming method for forming the pn junction 74 of the rod-shaped solar battery cell 70, it may be possible to use known methods such as selective impurity diffusion, ion implantation, and vapor phase or liquid phase epitaxial growth. As for forming of electrode and forming of antireflective film, it may be possible to use known methods, and the detailed description thereof is omitted.

Figure 5:
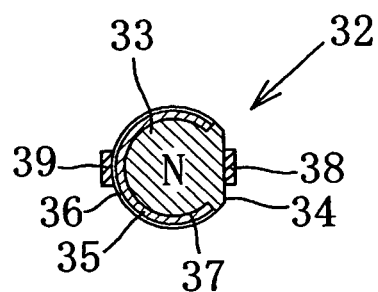
FIG. 5 is a cross-sectional view of a rod-shaped solar battery cell 32.
Figure 6:
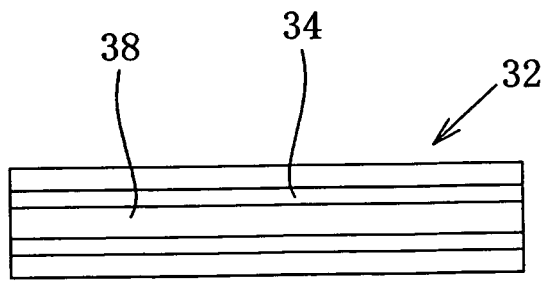
FIG. 6 is a right-side view of the solar battery cell 32 in FIG. 5.
Figure 7:
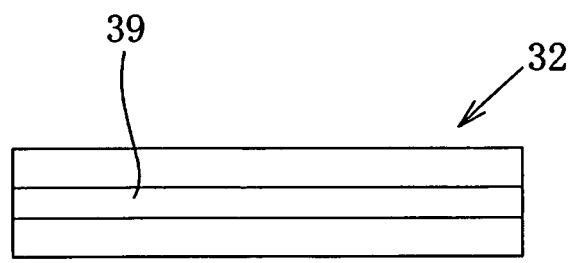
FIG. 7 is a left-side view of the solar battery cell 32 in FIG. 5.

Next, the rod-shaped solar battery cell 32 adopted to the rod light receiving solar battery sub module 31 of the second solar battery module 30 is explained with reference to FIGS. 5 to 7.

As a substrate 33 of the GaAs rod-shaped solar battery cell 32, the n-type GaAs single crystal having a circular cross-section is prepared to have thereon formed with a strap-shaped flat surface 34 parallel to the axial center of the substrate 33. In a state where the flat surface 34 and the vicinity of both sides thereof on a surface of the substrate 33 are masked with a Si3N4 film, the surface of the substrate 33 is brought into contact with a melt of GaAs with a solution of Ga at a high temperature, and then the temperature is decreased, thereby an n-type GaAs layer (not shown) is epitaxial-grown with a uniform thickness on the partial cylindrical surface not masked of the substrate 33.

Next, the GaAs melt is replaced, and while the surface of the substrate 33 is contacted with a Ga0.8Al0.2As melt doped with zinc, the temperature is further decreased, and then, a p-type Ga0.8Al0.2As layer 36 is continuously grown. While the p-type Ga0.8Al0.2As layer 36 is grown, zinc is heat-diffused from the Ga0.8Al0.2As melt to a middle depth of the partial cylindrical n-type GaAs layer to form a p-type GaAs layer 35 (separate conductive layer). At a boundary between the p-type GaAs layer 35 and the adjacent n-type GaAs layer, a pn junction 37 is formed.

In this way, for example, on the surface of the substrate 33 of a thin n-type GaAs single crystal having a diameter of about 1.7 mm, the n-type GaAs layer (not shown) of 20 to 50 μm thickness and the p-type GaAlAs layer 36 of 1 to 2 μm thickness are continuously grown in the partial cylindrical area not masked, and at the same time, from growing interfaces of both layers to a position of 0.5 to 1.0 μm toward the n-type GaAs layer side, the p-type GaAs layer 35 is formed, then a boundary between the epitaxial grown n-type GaAs layer (not shown) and the p-type GaAs layer 35 is formed into the pn junction 37 of the partial cylindrical shape. The p-type GaAlAs layer 36 functions as a light transmissive window layer, and owing to a hetero junction of the boundary face between the p-type GaAs layer 35 and the GaAlAs layer 36, a recombination rate of a small number carriers on the surface of the solar battery cell 32 is decreased, and, thus, a photoelectric conversion of the GaAs solar battery cell is improved.

Next, the Si3N4 film mask is removed by chemical etching, the surface of the n-type GaAs layer of the substrate 33 is exposed on the flat surface 34, and on the flat surface 34 with the n-type GaAs layer exposed, formed is a strap-shaped negative electrode 38 which is parallel to the axial center of the substrate 33 and is electrically connected to the n-type GaAs layer. On the opposite side from the negative electrode 38 with respect to the axial center of the substrate 33, a surface of the p-type GaAlAs layer 36 has a strap-shaped positive electrode 39 formed thereon which is parallel to the negative electrode 38. When forming the positive and negative electrodes 39 and 38, gold doped with Zn is deposited and sintered on the surface of the p-type GaAlAs layer 36 to form the positive electrode 39 ohmic-contacted to the p-type GaAlAs layer 36, and gold doped with Ge is deposited and sintered on the surface of the n-type GaAs layer exposed on the flat surface 34 to form the negative electrode 38 ohmic-contacted to the substrate 33. Note that the positive and negative electrodes 39 and 38 are the electrodes of several μm thickness. In this way, a continuous body of the rod-shaped solar battery cell 32 can be manufactured.

Then, the continuous body of the rod-shaped solar battery cell 32 is cut by use of a cutoff device such as a wire saw, at an interval of about 8 mm, for example, to form the rod-shaped solar battery cell 32. A plurality of rod-shaped solar battery cells 32 are bundled with an acid resistant wax, and thereafter, the cut surfaces are exposed, followed by being etched with chemicals to form an oxide film such that leakage current on the surface of the pn junction 37 at end faces is decreased. Incidentally, the entire surface other than the positive and negative electrodes 39 and 38 is covered by an antireflective film (not shown) of SiO2 or the like, to complete the rod-shaped solar battery cell 32. FIG. 20 shows a spectral sensitivity characteristic of the rod-shaped GaAs solar battery cell 32 with a curve B.

However, although in the above example, the Si3N4 film mask is adopted when forming the pn junction 37, it may be possible that the substrate of the n-type GaAs single crystal of a circular cross-section is adopted, and similarly to the above, the entire surface of the substrate is formed with the n-type GaAs layer and the p-type GaAlAs layer doped with Zn, to form the cylindrical pn junction, and thereafter, the strap-shaped portion parallel to the axial center of the substrate is removed by cutting work to form the flat surface 34, the strap-shaped n-type GaAs layer parallel to the axial center is exposed, and the flat surface 34 thereof is provided with the strap-shaped negative electrode 38.

As shown in FIG. 11, when the rod light receiving solar battery sub module 31 is manufactured, four rod-shaped solar battery cells 32 are arranged such that conductive directions from the positive electrodes 39 toward the negative electrodes 38 are aligned to a horizontal direction, and those solar battery cells 32 are arranged adjacent to one another in one plane in parallel. Subsequently, the positive and negative electrodes 39 and 38 of the solar battery cells 32 adjacent to each other are brought into contact and adhered by soldering or the electrically conductive adhesive to manufacture the sub module 31.

The second solar battery module 30 is configured such that, for example, five sub modules 31 are arranged in one plane in a line with the conductive directions and the axial center direction being aligned, and connected in parallel. In a case of assembling the second solar battery module 30, prepared are two connection rods 40a and 40b each formed of a rod material made of copper or an alloy of nickel and iron with a diameter of 0.5 to 1.0 mm, and at both end side of the five sub modules 31 a pair of connection rods 40a and 40b are arranged, and the positive electrode 39 of the sub module 31 at one end side is electrically connected with the connection rod 40a as the positive electrode lead by soldering or the electrically conductive adhesive, as well as the negative electrode 38 of the sub module 31 at the other end side is electrically connected with the connection rod 40b as the negative electrode lead by soldering or the electrically conductive adhesive.

Figure 8:
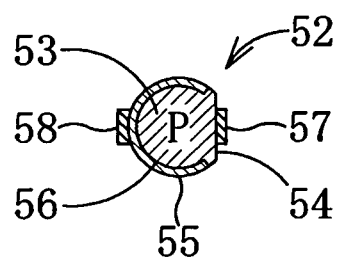
FIG. 8 is a cross-sectional view of a rod-shaped solar battery cell 52.
Figure 9:
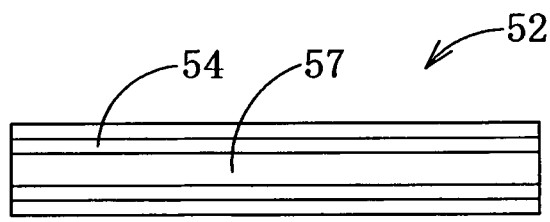
FIG. 9 is a right-side view of the solar battery cell 52 in FIG. 8.
Figure 10:
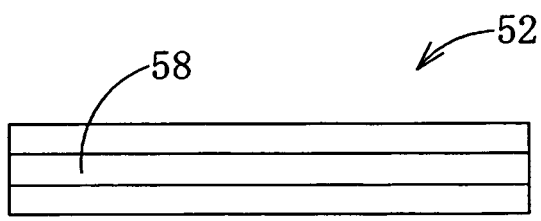
FIG. 10 is a left-side view of the solar battery cell 52 in FIG. 8.

Next, the rod-shaped solar battery cell 52 adopted to the rod light receiving solar battery sub module 51 of the third solar battery module 50 is explained with reference to FIGS. 8 to 10.

First, as the substrate 53 of the Ge rod-shaped solar battery cell 52, the rod-shaped p-type Ge single crystal having a diameter of about 0.9 mm and a circular cross-section is prepared to have thereon formed with the strap-shaped flat surface 54 parallel to the axial center of the substrate 53. The rod-shaped Ge single crystal described above is formed such that, for example, a seed crystal of a thin diameter is brought into contact with a germanium melt by a nozzle at the bottom of a crucible made of graphite containing melt germanium and is pulled out downward. The resulting substance is polished so as to become a cylindrical column of a constant diameter and have no unevenness on the surface, and is etched with chemicals.

After that, in a state where the flat surface 54 and the vicinity of both sides thereof on the substrate 53 are masked with a Si3N4 film, a rod-shaped p-type germanium is heated in a gaseous atmosphere containing antimony to provide an n-type diffusion layer 55 (separate conductive layer) of 0.5 to 1.0 μm depth from the surface to form the partial cylindrical pn junction 56. Then, the mask of the Si3N4 film is removed by etching; silver containing tin is deposited on the flat surface 54 at a center portion thereof with the p-type Ge being exposed; on the opposite side therefrom with respect to the axial center, silver containing antimony is deposited on the surface of the diffusion layer 55 including the n-type Ge; and then, sintering is performed; and provided are a strap-shaped positive electrode 57 ohmic-contacted to the flat surface 54 with the p-type Ge layer being exposed and a strap-shaped negative electrode 58 ohmic-contacted to the n-type diffusion layer 55. Note that the positive and negative electrodes 57 and 58 are electrodes of several μm thickness. In this way, the continuous body of the rod-shaped solar battery cell 52 is manufactured.

Subsequently, the continuous body of the rod-shaped solar battery cell 52 is cut by use of a cutoff device such as a wire saw, at an interval of about 8 mm, for example, to form the rod-shaped solar battery cell 52. The solar battery cells 52 in plural numbers are bundled with an acid resistant wax to mask the peripheral surfaces thereof, and each of the cut surfaces of the solar battery cells 52 is etched with chemicals by a known method to form an oxide film such that leakage current from the pn junction 56 at the cut face is decreased. FIG. 20 shows a spectral sensitivity characteristic of the Ge rod-shaped solar battery cell 52 with a curve C.

Incidentally, in the above example, the Si3N4 film mask is adopted when forming the pn junction 56. However, it may be possible that the cylindrical the pn junction is formed on the entire surface of the p-type Ge rod of a circular cross-section, thereafter, a strap-shaped portion parallel to the axial center on the surface portion of the rod-shaped Ge single crystal is removed by cutting work to form the strap-shaped flat surface 54 parallel to the axial center, on which the flat surface 54 the p-type Ge base is exposed and the strap-shaped positive electrode 57 is provided, on the opposite side from which positive electrode 57 provided is the strap-shaped negative electrode 58 connected to the n-type Ge layer.

As shown in FIG. 11, when manufacturing the rod light receiving solar battery sub module 51, eight rod-shaped solar battery cells 52 are arranged such that conductive directions from the positive electrodes 57 toward the negative electrodes 58 are aligned to a horizontal direction, and those solar battery cells 52 are arranged adjacent to one another in one plane in parallel. Subsequently, the positive and negative electrodes 57 and 58 of the solar battery cells 52 adjacent to each other are brought into contact and adhered by soldering or the electrically conductive adhesive to manufacture the sub module 51. Note that the sub modules 11, 31 and 51 are configured so as to have the same or almost the same length and width, that is, the light receiving area.

The third solar battery module 50 is configured such that, for example, five sub modules 51 are arranged in one plane in a line with the conductive direction and the axial center direction being aligned, and connected in parallel. In a case of assembling the third solar battery module 50, prepared are two connection rods 60a and 60b each formed of a rod material made of copper or an alloy of nickel and iron with a diameter of 0.5 to 1.0 mm, and at both end sides of the five sub modules 51 a pair of connection rods 60a and 60b are arranged, and the positive electrode 57 of the sub module 51 at one end side is electrically connected with the connection rod 60a as the positive electrode lead by soldering or the electrically conductive adhesive, as well as the negative electrode 58 of the sub module 51 at the other end side is electrically connected with the connection rod 60b as the negative electrode lead by soldering or the electrically conductive adhesive.

Next, description will be given of a configuration of the light collecting stacked solar battery device 1 having the above-described sub modules 11, 31 and 51 installed therein.

As shown in FIGS. 12 to 18, the stacked solar battery device 1 includes, for example, three sets of solar battery units 4, which are packaged by an enclosure case 2, six end stopping blocks 6 and a cover glass 5.

The enclosure case 2 is manufactured by press forming a thin stainless steel plate (thickness of 0.5 to 1.5 mm) to be formed in a rectangular shape in a plan view. The enclosure case 2 has three gutter-shaped recesses 3 arranged in a width direction thereof and in parallel. Each of the recesses 3 has substantially an inverted trapezoidal cross-section of which width gradually increases upward and has a pair of side walls 2a and a bottom wall 2b inner surfaces of which are made to be light reflecting surfaces in order to collect sunlight to the solar battery unit 4, and a portion of the bottom wall 2b other than both ends thereof is formed to be a protruding pedestal 2c protruding upward by a slight predetermined height and having a trapezoidal cross-section.

The surfaces of the side wall 2a and the bottom wall 2b of the recess 3 are mirror-like finished, formed with a metal film such as silver, or attached with magnesium oxide powder in order to improve a light reflecting effect. A pair of side walls 2a of the adjacent recesses 3 have a common support portion 2d formed horizontally at upper ends thereof. The enclosure case 2 has flat flange portions 2e formed at left and right ends thereof, and enclosing walls 2f formed so as to stand vertically from ends of the flange portions 2e with a predetermined height.

Figure 16:
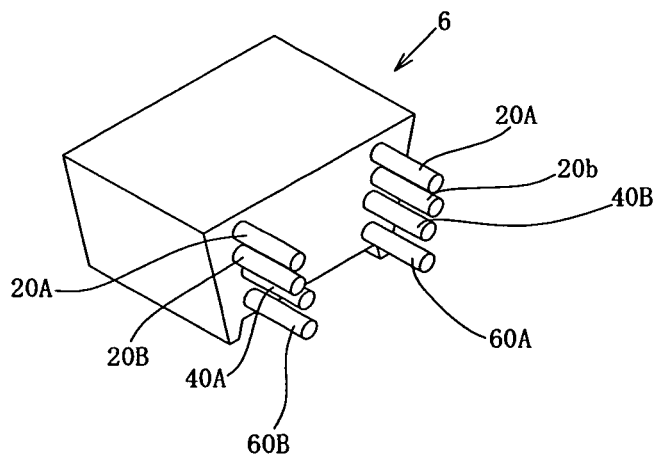
FIG. 16 is a perspective view of an end stopping block.
Figure 17:
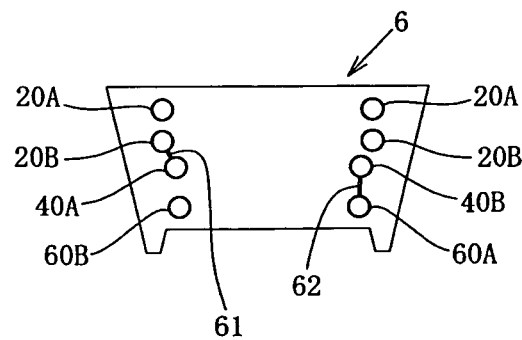
FIG. 17 is a front view of the end stopping block.

The end stopping block 6 is made of a white insulating ceramic material, and fitted to the both ends of the recess 3 of the enclosure case 2. As shown in FIGS. 16 and 17, the end stopping block 6 is provided with a plurality of metal connection pipes 20A, 20B, 40A, 40B, 60A and 60B in advance into which inserted respectively are the ends of the connection rods 20a, 20b, 40a, 40b, 60a and 60b of the solar battery modules 10, 30 and 50. These connection pipes 20A, 20B, 40A, 40B, 60A and 60B are projected to an inside of the end stopping block 6 by a predetermined length and projected to an outside of the end stopping block 6 by a predetermined length. The above connection pipes are made of Fe58%-Ni42% alloy or the like, air-tightly penetrating through the end stopping block 6.

In order to connect in series the solar battery modules 10, 30 and 50 in the respective solar battery units 4, the end stopping block 6 provided with in an outer surface side thereof a connector 61 connecting in series between the connection pipes 20B and 40A inserted with the connection rods 20b and 40a, as well as a connector 62 connecting in series between the connection pipes 40B and 60A inserted with the connection rods 40b and 60a.

As shown in FIGS. 12 to 14, and FIG. 18, the cover glass 5 is made of a transparent glass material. The cover glass 5 includes three partial cylindrical lens portions 5a respectively collecting sunlight toward the three recesses 3, a pair of left and right flat plate portions 5b to be fixed to the left and right flange portions 2e of the enclosure case 2, inverted-trapezoid fitted portions 5c of a small height to be fitted each to an upper end of the recess 3, and two engaged grooves 5d to be engaged to the two support portions 2d of the enclosure case 2, and a lower face of the cover glass 5 is formed to be almost flat.

Next, description will be given of a method for assembling the stacked solar battery device 1.

With a state that the end stopping block 6 is adhered to a rear end portion of each of the recesses 3, rear end side portions of the connection rods 60a and 60b of the solar battery module 50 are inserted to the connection pipes 60A and 60B of the relevant end stopping block 6, respectively, rear end side portions of the connection rods 40a and 40b of the solar battery module 30 are inserted to the connection pipes 40A and 40B of the relevant end stopping block 6, respectively, and rear end side portions of the connection rods 20a and 20b of the solar battery module 10 are inserted to the connection pipes 20A and 20B of the relevant end stopping block 6, respectively, and then, the solar battery modules 10, 30 and 50 are kept horizontally in parallel with one another.

Next, front end side portions of the connection rods 20a, 20b, 40a, 40b, 60a and 60b of the solar battery modules 10, 30 and 50 are inserted to the connection pipes 20A, 20B, 40A, 40B, 60A and 60B of the end stopping block 6 on a front side, and thereafter, the end stopping block 6 is positioned and adhered to a front end portion of the recess 3. In this way, the solar battery modules 10, 30 and 50 in the respective solar battery units 4 are stacked (layered) vertically in the recess. 3 of the enclosure case 2 at a predetermined small interval therebetween.

Thereafter, these connection pipes 20A, 20B, 40A, 40B, 60A and 60B are electrically connected with the connection rods 20a, 20b, 40a, 40b, 60a and 60b by calking the connection pipes 20A, 20B, 40A, 40B, 60A and 60B. However, the electrical connection may be performed by adhering with the electrically conductive adhesive. Note that the connection pipes 20A, 20B, 40A, 40B, 60A and 60B are also utilized as external terminals.

Next, the recess 3 having the solar battery modules 10, 30 and 50 housed therein are filled with a transparent synthetic resin (e.g., silicon rubber), followed by being defoamed and subjected to heat-curing to polymerize the synthetic resin, and then all of the sub modules 11, 31 and 51 are brought into a state of being buried in the synthetic resin sealing material 63. Thereafter, the cover glass 5 with a transparent silicon resin or the like being applied to a lower surface thereof is covered over the recesses 3, the support portion 2d is engaged with the engaged groove 5d to be adhered, and the flat plate portion 5b is adhered to the flange portion 2e. Gaps between the cover glass 5 and the enclosure case 2 and between the cover glass 5 and the synthetic resin sealing material 63 are sealed with a transparent silicon resin 64.

Figure 12:
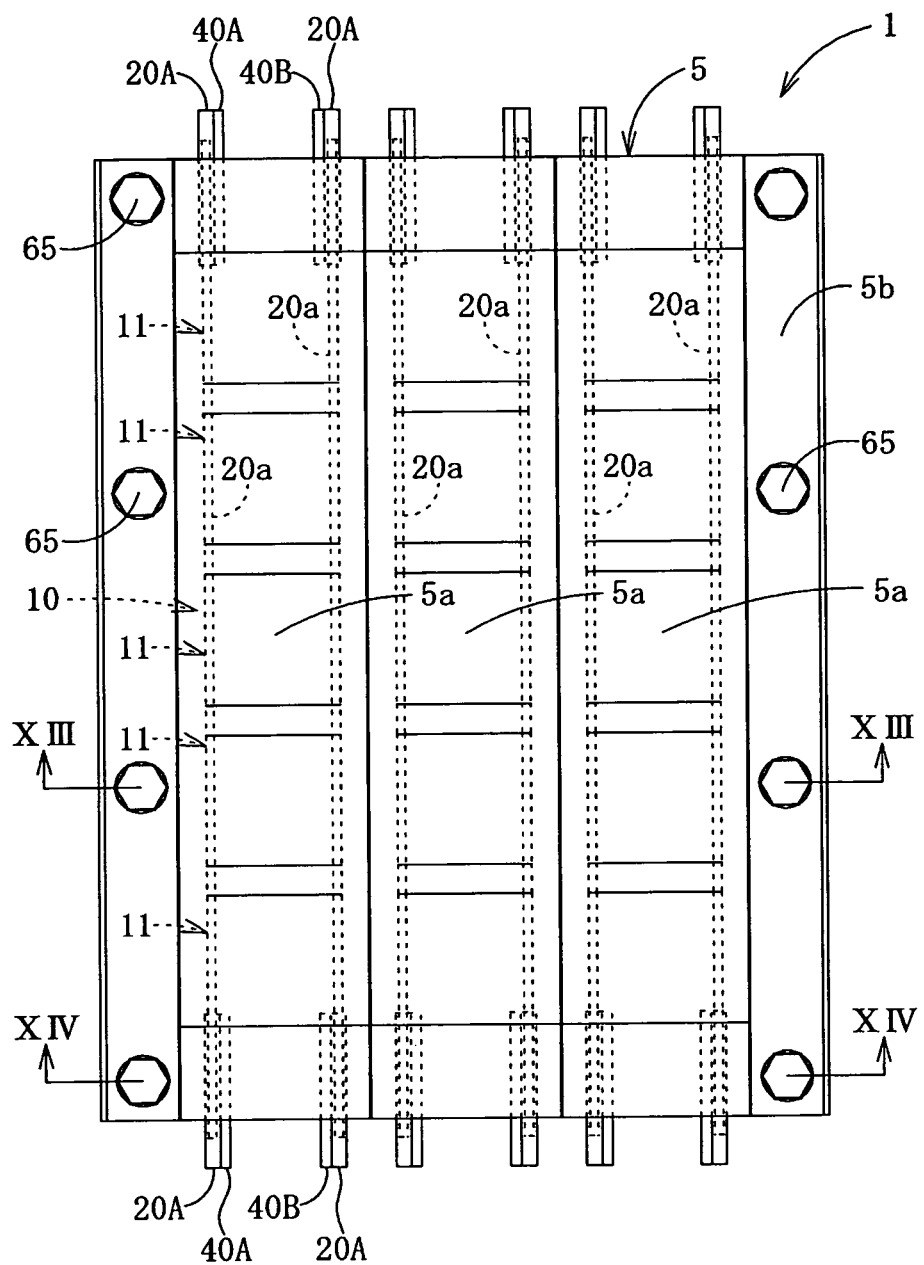
FIG. 12 is a plan view of the solar battery device.
Figure 13:
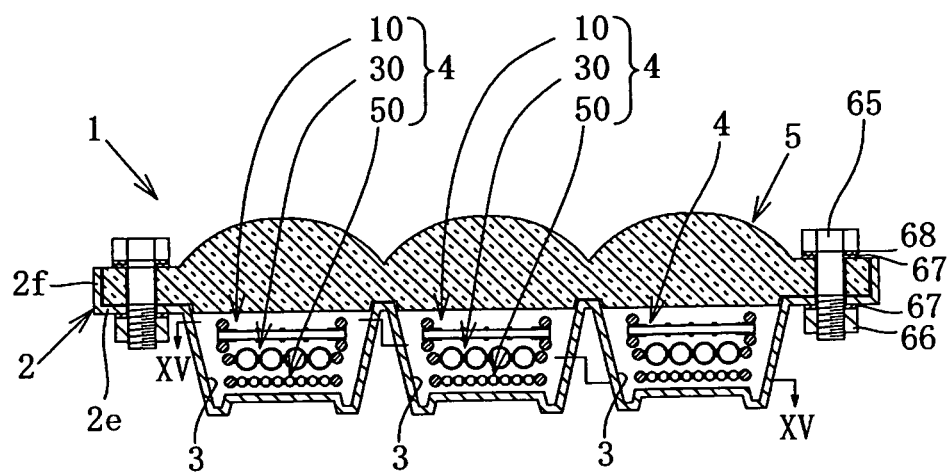
FIG. 13 is a cross-sectional view taken along a line XIII-XIII in FIG. 12.
Figure 14:
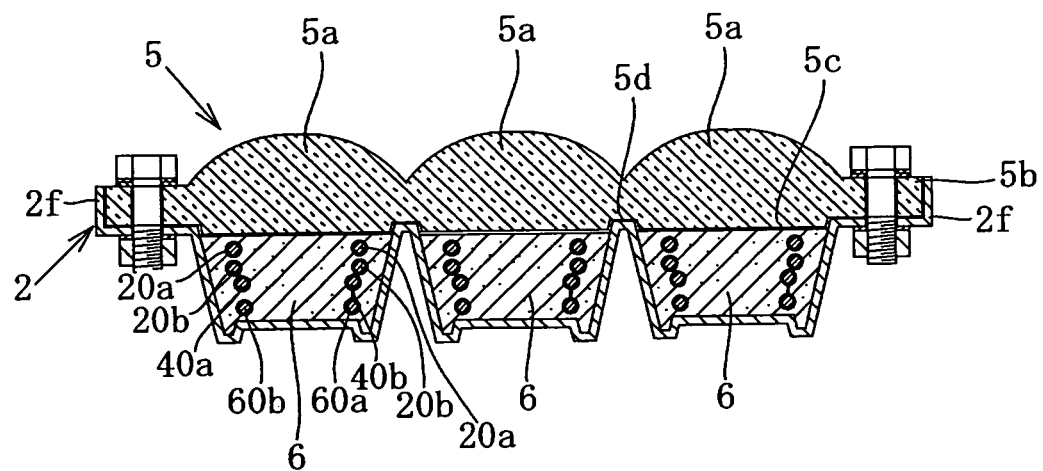
FIG. 14 is a cross-sectional view taken along a line XIV-XIV in FIG. 12.
Figure 15:
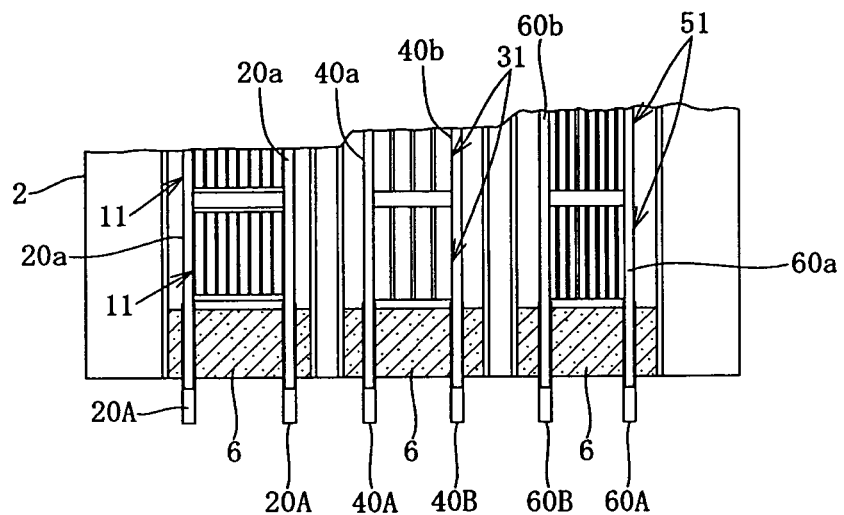
FIG. 15 is a partial cross-sectional view taken along a line XV-XV in FIG. 13.

Next, as shown in FIGS. 12 to 14, the flat plate portions 5b of the cover glass 5 and the flange portions 2e of the enclosure case 2 are clamped by four bolts 65 and nuts 66, respectively on the left and right both ends thereof. The clamping is performed via a packing 67 made of a butyl rubber and a washer 68 at this bolt-clamping portion.

Next, operations of the solar battery device 1 described above are explained.

Figure 19:
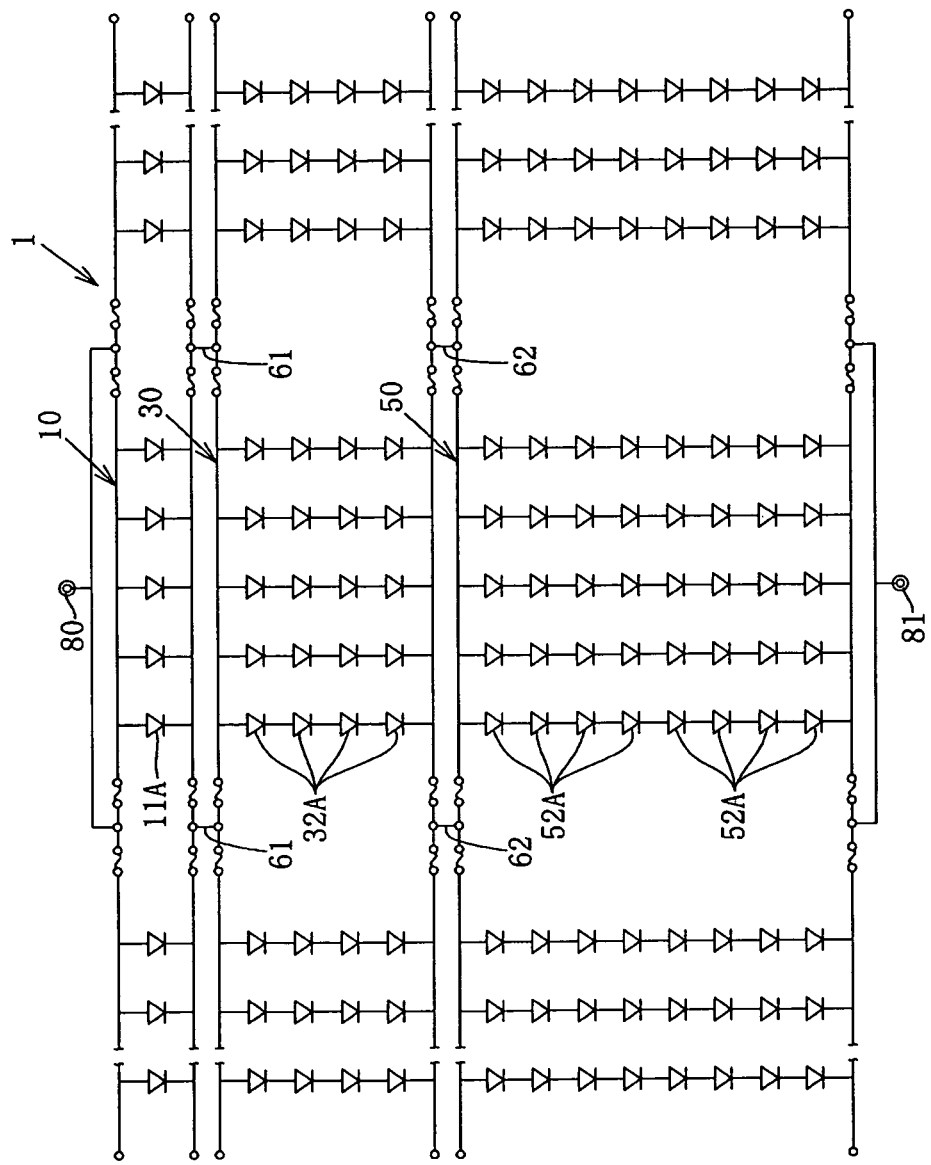
FIG. 19 is an equivalent circuit diagram of the solar battery device.

FIG. 19 is a diagram showing an equivalent circuit of the stacked solar battery unit 4, in which the solar battery cells 11, 32 and 52 are shown by diodes 11A, 32A and 52A. The solar battery modules 10 and 30 are connected in series at both the front and rear end sides thereof by a connector 61 electrically connecting the connection pipes 20B and 40A.

The solar battery modules 30 and 50 are connected in series at both the front and rear end sides thereof by a connector 62 electrically connecting the connection pipes 40B and 60A. Note that with respect to the center one set of the solar battery unit 4, the solar battery units 4 on the left and right sides in FIGS. 13 and 14 are connected in parallel via the connection pipes 20A, 20B, 40A, 40B, 60A and 60B, and lead wires. A positive electrode terminal 80 is formed at a center portion of the lead wire connected to the connection pipe 20A, and a negative electrode terminal 81 is formed at a center portion of the lead wire connected to the connection pipe 60B.

As the spectral sensitivity characteristics of the solar battery cells 11, 32 and 52 shown in FIG. 20, the sensitivity wavelength band where the photoelectric conversions is possible and an energy density are varied depending on the kinds of the solar battery cells 11, 32 and 52. The energy density of the sunlight on the ground is 100 mW/cm2, whereas an open voltage of only the solar battery cell with the sunlight is about 1.2 volts in the GaAsP/GaP solar battery cell 11 (sub module), about 0.9 volt in the GaAs solar battery cell 32, and about 0.4 volts in the Ge solar battery cell 52.

In a situation where the solar battery modules 10, 30 and 50 are connected in series, if output currents of the solar battery modules 10, 30 and 50 are largely varied, the output currents thereof are restricted by an output current of a solar battery module having the smallest output current, and other solar battery modules cannot generate the output current larger than that as well. Consequently, since the GaAsP/GaP solar battery cell 11 has the smallest output current per light receiving area in the solar battery device 1, the output currents of other sub modules 31 and 51 are set to be substantially equal to the output current of the GaAsP/GaP solar battery cell 11 such that the output currents of the solar battery modules 10, 30 and 50 are approximately the same value. Therefore, the solar battery cells 11, 32 and 52 can exhibit respective electric-generating capacities to a maximum extent.

The solar battery module 10 can increase or decrease the output current by increasing or decreasing the number of the sub modules 11 (the number of the connection in parallel), and can increase or decrease the output current by increasing or decreasing the light receiving area of the sub module 11. The solar battery modules 30 and 50 can increase or decrease the output current by increasing or decreasing the number of the sub modules 31 and 51 (the number of the connection in parallel), and can increase or decrease the output voltages of the sub modules 31 and 51 by increasing or decreasing the number of the solar battery cells 32 and 52 to be installed in the sub modules 31 and 51 (the number of the connection in series).

Figure 18:
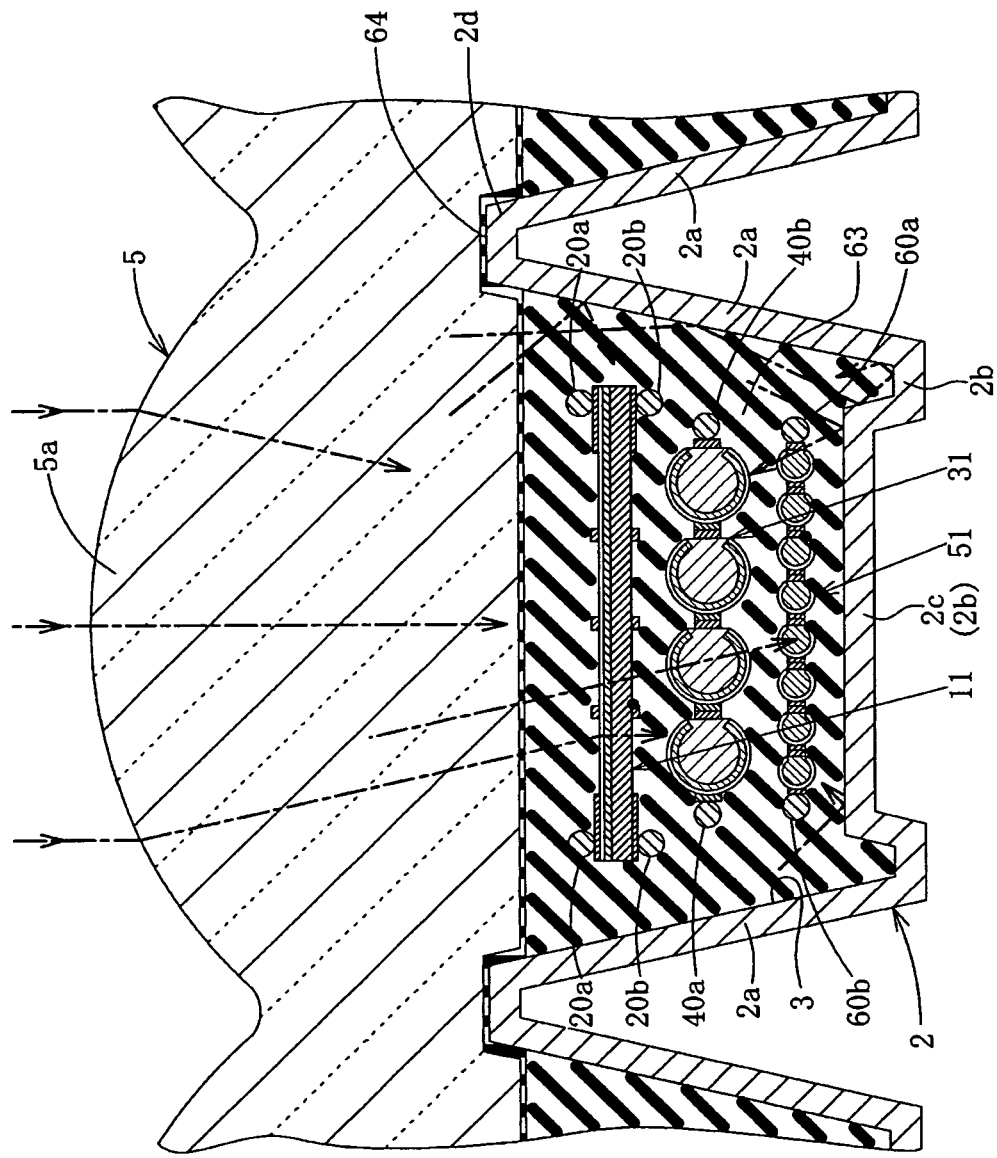
FIG. 18 is an enlarged cross-sectional view of a main portion of the solar battery device.

The light collecting solar battery device 1 utilizes a light collecting effect owing to refraction by the lens portions 5a of the cover glass 5 and light reflection and collection of the enclosure case 2 to obtain a large output with the small-sized solar battery modules 10, 30 and 50. FIG. 18 is a drawing illustrating the light collecting effect using the center one set of solar battery unit 4 as an example. If the direct sunlight is incident on the cover glass 5 perpendicularly, the sunlight is refracted by the lens portion 5a to be collected. Many direct sunlights are incident on the surface of the upper most GaAsP/GaP solar battery cell 11 (sub module 11), the light in the sensitivity wavelength band of the curve A in FIG. 20 is absorbed, and the light longer in the wavelength than that is incident on the surface of the sub module 31 including the GaAs solar battery cell 32 thereunder.

The sub module 31 absorbs the light in the sensitivity wavelength band of the curve B in FIG. 20, the light longer in the wavelength than that is incident on the surface of the sub module 51 including the Ge solar battery cell 52 thereunder. The sub module 51 absorbs the light in the sensitivity wavelength band of the curve C in FIG. 20, the light longer in the wavelength than that is incident on the surface of the protruding pedestal 2c thereunder, occurring reflection and absorption. The lights absorbed by the respective solar battery cells 11, 32 and 52 are converted into the electrical energy to obtain the electrical outputs from the external terminals 80 and 81 of the respective solar battery modules 10, 30 and 50.

Of the sunlights passing through the lens portions 5a, the sunlight which is not directly incident on the surface of the GaAsP/GaP solar battery cell 11 (sub module 11) and is incident on the tilted side wall 2a is reflected there to be incident on the surface of the sub modules 31 and 51. In the relevant sunlights, some are absorbed by that surface, others are reflected to go in other directions. The latter lights are reflected in multiple among the enclosure case 2, the end stopping block 6, the cover glass 5, and the respective sub modules 11, 31 and 51, and the lights to reach the surfaces of the sub modules 11, 31 and 51 are absorbed to be photoelectric-converted.

There are small intervals among the sub modules 11, 31 and 51 as well as between the Ge sub module 51 and the protruding pedestal 2c, where the light can enter. The sunlight is absorbed in a higher ratio by the surfaces of the rod-shaped solar battery cells 32 and 52 which surfaces have a cylindrical shape compared with the solar battery cell 11 whose light receiving surface is flat, achieving the improved output of the solar battery device 1.

Incidentally, in FIG. 18, for example, the side wall 2a of the recess 3 is drawn in a flat surface, but it may be designed in a curved surface so as to collect many reflection lights effectively to the solar battery cells 11, 31 and 51. Moreover, the GaAs sub module 31 and the Ge sub module 51 have a function to collect the light which has the wavelength passing through the modules 31 and 51 (the light which has the wavelength can not be absorbed) like the lens portion 5a. Therefore, arrangement of the solar battery cells can be devised from an optical point of view such that the collected light enters a solar battery sub module placed ahead thereof.

Light energy which is not photoelectric-converted by the solar battery modules 10, 30 and 50 is converted into thermal energy. As temperatures of the solar battery cells 11, 32 and 52 rise with the thermal energy, the photoelectric conversion efficiency decreases. Therefore, it is important that heat radiation capability of the enclosure case 2 is increased to lower the temperature rise. Thus, in this embodiment, the enclosure case 2 is formed into a gutter shape to enlarge its surface area such that heat generated from the solar battery cells 11, 32 and 52 is easily radiated to the external. Incidentally, it may be configured that the surface surrounding the outside of the enclosure case 2 is provided with a cover member (not shown) to form a duct, through which a cooling medium is circulated between the enclosure case 2 and the cover member, allowing improvement of a cooling effect.

Here, as a spectral distribution of the incident light varies depending on a place and a weather condition, the output current of the solar battery cell constituting the stacked solar battery device 1 varies. Correspondingly to this, it may be also configured such that the parallel connection number and the series connection number of the sub modules 11, 31 and 51 is changed to maintain the maximization of the entire output. Since the solar battery modules 10, 30 and 50 have respectively independent external terminals (connection pipes), it may be that a plurality of electronic switch devices are provided which change the parallel connection number and the series connection number, and the electronic switch devices are controlled to be on and off to automatically maximize the output depending on the spectrum variation.

Moreover, the solar battery modules 10, 30 and 50 are provided with the connection pipes as the external terminals, and thus, with respect to the sunlight whose condition varies, it is possible to individually measure output characteristics of each solar battery module and evaluate the performance. Then, based on the measured data, it becomes possible to optimally design a reflection structure of the lens portion 5a of each solar battery module of the solar battery device 1 and the inner surface of the enclosure case 2, and the arrangement, the parallel connection number and the series connection number of the solar battery cell.

In the sub module 31, a plurality of rod-shaped solar battery cells 32 are arrange in parallel and connected in series via the positive and negative electrodes 39 and 38 to form the rod light receiving solar battery sub module 31. Therefore, the number of the rod-shaped solar battery cells 32 can be varied by varying the diameter of the substrate 33 to vary a voltage generated in the sub module 31. This similarly applies to the sub module 51. Moreover, in the solar battery module 30, since a plurality of sub modules 31 are connected in parallel, the current generated in the solar battery module 30 can be varied by varying the number of the sub module 31 connected in parallel. This similarly applies to the solar battery module 50.

In the rod-shaped solar battery cell 32, since a length in the axial center thereof can be set to from several to a dozen times the diameter of the substrate 33, the light receiving area can be significantly increased compared with the granular solar battery cell. In addition, a plurality of rod-shaped solar battery cells 32 can be arranged densely in parallel to configure the rod light receiving solar battery sub module 31, and therefore, a ratio of the light receiving area to a projected area of the sunlight can be set larger, increasing a light receiving efficiency for receiving the sunlight. This similarly applies to the rod-shaped solar battery cell 52.

Moreover, in the rod light receiving solar battery sub modules 31 and 51, the number of wire connecting positions to electrically connect the solar battery cells can be significantly less compared with the sub module provided with a plurality of granular solar battery cells, reducing significantly the cost for assembling the sub module including the wire connection cost.

The solar battery device 1 includes plural kinds of the solar battery modules 10, 30 and 50 which are different from one another in a sensitivity wavelength band, and the shorter center wavelength of the sensitivity wavelength band the solar battery module has, the closer to the incident side of the sunlight the solar battery module is positioned, therefore the sunlight in a wide wavelength range of the sunlight spectrum can be photoelectric-converted. The shorter wavelength the light has, the less transmissive the light is, thus, as described above, the plural kinds of solar battery modules 10, 30 and 50 are stacked such that the shorter center wavelength of the sensitivity wavelength band the solar battery module has, the closer to the incident side of the sunlight the solar battery module is positioned, thereby allowing increase of the photoelectric conversion efficiency of the respective solar battery modules.

In the solar battery device 1, the plural kinds of solar battery modules 10, 30 and 50 vertically stacked are connected in series, the output currents of which are set substantially equal to one another, and thereby allowing the solar battery modules to exhibit respective electric-generating capacities to a maximum extent.

Of three kinds of solar battery modules, two kinds of solar battery modules 30 and 50 are configured respectively with a plurality of rod light receiving solar battery sub modules 31 and 51. Therefore, the output voltages of the rod light receiving solar battery sub modules 31 and 51 can be adjusted by varying the number of the connections in series of the rod-shaped solar battery cells 32 and 52 in the respective sub modules 31 and 51, and the output currents of the solar battery modules 30 and 50 can be adjusted by varying the number of the connections in parallel for connecting in parallel a plurality of rod light receiving solar battery sub modules 31 and 51. Thereby, it becomes easy to set the output currents to be substantially the same among the plural kinds of solar battery modules 10, 30 and 50 vertically stacked.

The substrate of the rod-shaped solar battery cells 32 and 52 can be manufactured more easily with a lower cost compared with manufacturing of a semiconductor single crystal for the substrate of a planar and spherical solar battery cells because a thin cylindrical single crystal can be easily grown by pulling upward or downward the seed crystal from the semiconductor melt.

The rod-shaped solar battery cells 32 and 52, when being manufactured, after forming the pn junction and the electrodes, can be cut into a desired length to be used, thus, suitable for mass production.

The rod-shaped solar battery cells 32 and 52 each are provided with the partial cylindrical pn junction and a pair of strap-shaped electrodes which are respectively parallel to the axis direction and connected to the surface at a center portion of the p-type region and the n-type region. There is little directivity of sunlight at the surface perpendicular to the axial center of the substrate, thus, not only the direct incident light but also the light in directions reflected or scattered can be used.

The rod-shaped solar battery cells 32 and 52 have the strap-shaped elongated electrodes 38, 39, 57 and 58 formed, allowing the connection points with the external lead to be reduced. Moreover, the electrodes of the solar battery cells 32 and 52 can directly join to each other by soldering or the conductive synthetic resin without a dynamic stress. In the sub modules 31 and 51, the number of solar battery cells 32 and 52 connected in series respectively can be set freely, therefore, a high voltage output can be attained readily.

In the rod-shaped solar battery cells 32 and 52, a ratio occupied by the electrodes in the light receiving area is small compared with the planar light receiving solar battery cell 11, a shadow loss is small, and the current flows in a direction perpendicular to the electrode thickness to lower a resistance. In the sub modules 31 and 51, the rod-shaped solar battery cells are arranged densely in parallel to one another and directly connected with one another to be modularized, enabling free extension of the light receiving area. The sub module can have the light receiving surface area a ratio of which to the projected area is large, allowing manufacture of the sub module with a compact size.

In the module where the spherical solar battery cells are arranged and wire-connected, a gap is generated between the cells. However, the rod-shaped solar battery cells 32 and 52 can be arranged and connected with almost no gap, and thereby, the output per unit area can be increased with respect to the direct incident light in a vertical direction. This is advantageous in a case of manufacturing the solar battery module to collect sunlight by the lens. As the sub modules 31 and 51, it is possible to manufacture the sub modules the same in the area and different in the number of the connection in series using rod-shaped cells different in the diameter.

In the recess 3 of the enclosure case 2, the sub modules 11, 31 and 51 different in the sensitivity wavelength band with one another are arranged via the transparent synthetic resin at a constant interval, thus, the heat which the respective solar battery cells generate by absorbing the light is dispersed in terms of the position. Accordingly, there is no partial temperature rising intensively, thereby, the solar battery cells 11, 32 and 52 rise in temperature a little.

The enclosure case 2 is configured such that the inner surface is a light reflection surface and the outer surface is a heat radiation surface, which serves as light collection and restraining of the temperature rising, and is useful for improving a conflicting relation. The end stopping block 6 is made of the white ceramic which is light-reflectable or light-scatterable to trap the sunlight in the recess 3. This makes the light incident indirectly on the rod-shaped solar battery cells 32 and 52 to increase a light use efficiency.

Since a plurality of solar battery units 4 can be connected in parallel via the connection pipes 20A, 20B, 40A, 40B, 60A and 60B (external terminals), the solar battery modules 10, 30 and 50 are connected in series and connected in parallel to enable constitution of an electrical power supply with required output voltage and current.

A position adjustment of the center of the lens portion 5a of the cover glass 5 and the center of the recess 3 can be done easily by engaging the engaged groove 5d of the cover glass 5 with the support portion 2d of the enclosure case 2. Since the protruding pedestal 2c is formed at the bottom wall 2b of the recess 3 of the enclosure case 2, rigidity of the enclosure case 2 can be enhanced and the heat radiation area can be increased. Further, the end stopping block 6 and the lens portion 5a of the cover glass 5 also improve the mechanical strength of the entire solar battery device 1.

The sub modules 11, 31 and 51 are buried in the flexible transparent silicon resin, and the enclosure case 2 and the cover glass 5 are clamped and sealed via the packing 67 by the bolts 65 and the nuts 66, securing the mechanical strength, the airtightness relative to the atmosphere and weather resistance to the sunlight.

In a case that the stacked solar battery device 1 becomes unnecessary, the clamping between the bolts 65 and the nuts 66 is released to disassemble into the cover glass 5 and the enclosure case 2, and further, the sub modules 11, 31 and 51 can be easily separated and retrieved from the sealing material 63 made of the transparent resin by adding an organic solvent or a high temperature steam.

Next, description will be given of examples in which the above embodiment is partially modified.

1) The embodiment was described in which three recesses 3 are formed in the enclosure case 2 and three sets of solar battery units 4 are installed therein. However, this is only an example, and four or more recesses 3 may be formed and four or more sets of solar battery units 4 may be installed in some cases, as needed.

Moreover, the embodiment was described in which five sub modules 11, 31 and 51 respectively are installed in the solar battery modules 10, 30 and 50. However, the number of the sub modules installed in the solar battery modules 10, 30 and 50 may be set appropriately, and six or more sub modules 11, 31 and 51 may be installed in some cases. In this way, the output voltage and the output current of the solar battery device 1 can be set freely.

2) The number of solar battery cells 32 installed in the sub module 31 is not limited to four, but five or more cells 32 may be installed in some cases. This similarly applies to the sub module 51. Nine or more solar battery cells 52 may be installed in the sub module 51.

3) In place of the uppermost GaAsP/GaP solar battery cell 11, the planar light receiving solar battery cell may be employed with a semiconductor crystal of GaP, InGaP, SiC, GaN, InGaN and ZnO used as the substrate, and the rod light receiving solar battery sub module may be adopted which includes the solar battery cell using the substrate constituted by any of the semiconductor crystals.

4) In place of the rod-shaped Ge cell 52 of the lowermost sub module 51, the solar battery cell may be adopted which includes the substrate of a crystal of GaSb, InGaAs, and InGaAsSb.

5) In place of the rod-shaped solar battery cell 32 of the middle sub module 31, adopted may be the planar light receiving solar battery cell including the substrate of a crystal of GaAlAs, Si and InP, or the rod-shaped solar battery cell using the substrate constituted by any of the semiconductor crystals.

6) In the solar battery device 1 of the embodiment described above, the example was described in which three kinds of the solar battery modules 10, 30 and 50 different in the sensitivity wavelength band are installed in a stacked manner. However, it may be possible that the solar battery device in which two kinds of solar battery modules different in the sensitivity wavelength band are installed in a stacked manner. In this case, at least one kind of solar battery module should be constituted by the rod light receiving solar battery sub module. Incidentally, the solar battery device can also be manufactured in which four or more kinds of solar battery modules different in the sensitivity wavelength band are installed in a stacked manner.

7) In place of the cover glass 5, a cover member made of a synthetic resin material such as transparent polycarbonate or acrylic may be adopted, on which cover member formed is a lens portion similar to the lens portion 5a.

8) As for the materials for the enclosure case 2, there may be adopted an Fe58%-Ni42% alloy plate in which an inner side surface is plated with a metal of high reflection ratio such as silver, nickel or the like, or an aluminum plate, an aluminum alloy plate or a magnesium alloy plate the surfaces of which are subjected to anticorrosion treatment.

Figure 21:
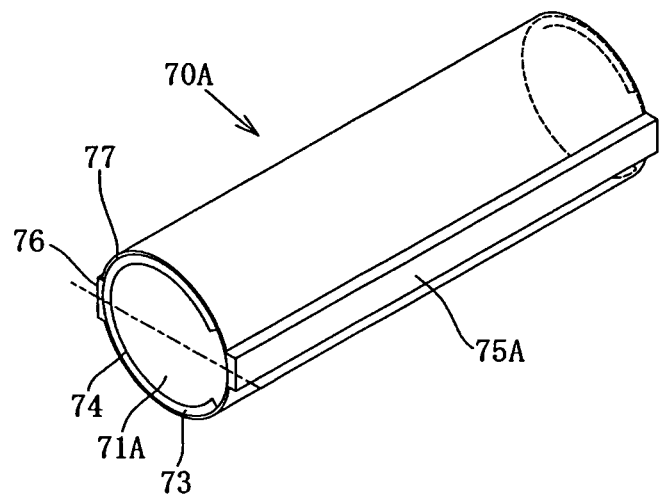
FIG. 21 is a perspective view of a rod-shaped solar battery cell according to a modified embodiment.

9) In the rod-shaped solar battery cells 32 and 52, the strap-shaped flat surfaces 34 and 54 are formed on the substrate, whose flat surface is provided with a single electrode (38, 57). However, as a rod-shaped solar battery cell 70A shown in FIG. 21, the flat surface may be omitted, and a single electrode (75A) of strap-shape ohmic-contacted to the substrate 71A may be formed on a surface of the substrate 71A of a circular cross-section. However, in this case, it is preferable to configure such that materials, colors, and shapes of the positive and negative electrodes are made different to enable to identify the positive and negative electrodes. Also, those similar to the solar battery cell 70 in FIG. 4 are attached the same numerals, and the description is omitted.

INDUSTRIAL APPLICABILITY

The stacked solar battery device can be utilized for various power generation devices generating electricity by use of the sunlight.

What is claimed is:

1. A stacked solar battery device, comprising:
    a plurality of solar battery modules electrically connected in series, each one module among the plurality of solar battery modules occupying a unique generally planar layer of said stacked solar battery device;
    each one solar battery module of the plurality of solar battery modules comprising a first connection rod, a second connection rod, and a plurality of light receiving sub-modules, wherein said first connection rod and said second connection rod are arranged in parallel and respectively form one and another of a positive electrode and negative electrode for said one solar battery module, wherein all sub-modules of said one solar battery module are arranged in a common plane defined by said first connection rod and second connection rod and are located between and in direct electrical connection with said first connection rod and said second connection rod;
    each one sub-module among said all sub-modules in said one solar battery module comprising a plurality of rod-shaped solar battery cells, wherein all rod-shaped solar battery cells in said one sub-module are electrically connected in series and arranged lengthwise side-by-side in said common plane of said one solar battery module, each one rod-shaped cell among said all rod-shaped solar battery cells having a longitudinal axis arranged side-by-side in parallel with said first connection rod and said second connection rod of said one solar battery module, said each one rod-shaped cell, comprising:
        a substrate made of a rod-shaped semiconductor crystal of a p-type or n-type semiconductor having a circular or partial circular cross-section, the substrate extending axially;
        a conductive layer formed at a portion of a surface layer of said substrate except for a strap-shaped portion parallel to an axial center of said substrate, and having a conductivity type different from said substrate, said strap-shaped portion extending for a substantial axial length of said one rod-shaped cell;
        a pn junction formed with said substrate and said conductive layer and having a partial cylindrical shape;
        a first strap-shaped electrode extending axially for the substantial axial length of said one rod-shaped cell, said first strap-shaped electrode being in physical and ohmic contact with a surface of said strap-shaped portion of said substrate for said substantial axial length; and
        a second strap-shaped electrode extending axially for the substantial axial length of said one rod-shaped cell, said second strap-shaped electrode being in physical and ohmic-contact with a surface of said conductive layer for said substantial axial length on an opposite longitudinal side from the first strap-shaped electrode with respect to said axial center of said substrate;

wherein for said side-by-side arrangement of said all rod-shaped solar battery cells in said one sub-module, the first strap-shaped electrode of a first rod-shaped cell is in physical and ohmic contact with the second strap-shaped electrode of a second rod-shaped cell adjacent to said first rod-shaped cell for said substantial axial length for every adjacency of rod-shaped solar battery cells among said all rod-shaped solar battery cells in said on sub-module; and
    wherein for a first-end rod-shaped solar battery cell at a first end of said side-by-side arrangement, one of said first strap-shaped electrode and said second strap-shaped electrode is in physical and ohmic contact with one of said first connection rod and said second connection rod for said substantial axial length, and wherein for a second-end rod-shaped solar battery cell at an opposite, second end of said side-by-side arrangement other of said first strap-shaped electrode and second strap-shaped electrode is in physical and ohmic contact with other of said first connection rod and said second connection rod for said substantial axial length.

2. The stacked solar battery device according to claim 1, wherein said plurality of solar battery modules comprises plural kinds of solar battery modules having different sensitivity wavelength bands, said plural kinds of solar battery modules being stacked so that a first solar battery module having a shortest center wavelength of the sensitivity wavelength band is positioned closer to an incident side of sunlight, wherein at least one kind of the solar battery module comprises a plurality of planar light receiving sub modules, each of which comprises a planar light receiving solar battery cell having a planar pn junction.

3. The stacked solar battery device according to claim 2, wherein said first solar battery module comprises said plurality of planar light receiving sub-modules, and wherein each one of a second and third kind of solar battery module comprises a plurality of said light receiving sub-modules that comprise said plurality of rod-shaped solar battery cells.

4. The stacked solar battery device according to claim 2 or 3, wherein all sub-modules are configured so that light receiving areas thereof are equal to each other.

5. The stacked solar battery device according to claim 3, wherein said first solar battery module further comprises a first connection rod and a second connection rod arranged in parallel and respectively form a positive electrode and negative electrode for said first solar battery module, wherein all planar light-receiving sub-modules of said first solar battery module are arranged in direct electrical connection with said first connection rod and said second connection rod of said first solar battery module.

6. The stacked solar battery device according to claim 5, wherein an enclosure case made of a metal plate and having one or more recesses protruding downward is provided; and
    the one or more recess of the enclosure case houses the plural kinds of solar battery modules in a stacked state.

7. The stacked solar battery device according to claim 6, wherein said enclosure case has a plurality of said recesses arranged in parallel and horizontally in a width direction of said recess; and
    the plural kinds of solar battery modules are housed in each of the plurality of recesses in a stacked state.

8. The stacked solar battery device according to claim 7, wherein a plurality of end stopping blocks are provided each of which closes an end of the recess of said enclosure case; the end stopping block is provided with a plurality of connection pipes made of metal for inserting ends of said first and second connection rods for each one solar battery modules of said plurality of solar battery modules so as to form a first electrical connection of all the first connection rods and so as to form a second electrical connection of all the second connection rods, and wherein the connection pipes are projected to an outside of the end stopping block as external terminals.

9. The stacked solar battery device according to claim 7, wherein at least one of the recesses of said enclosure case has substantially an inverted trapezoid cross-section of which the width gradually increases upward, and a pair of side walls and a bottom wall of the recess have inner surfaces made to be light reflecting surfaces.

10. The stacked solar battery device according to claim 9, wherein a lens member having a lens portion having a light collecting function to collect the sunlight toward the plurality of solar battery modules is provided closer to the incident side of sunlight than the plurality of solar battery modules.

11. The stacked solar battery device according to claim 10, wherein spaces in the plurality of recesses of said enclosure case are filled with transparent synthetic resin sealing materials, and they are packaged by said enclosure case and the lens member.

12. The stacked solar battery device according to claim 9, wherein a trapezoidal protruding pedestal protruding upward by a slight predetermined height is formed at the bottom wall of said enclosure case.

\* \* \* \* \*